(12) United States Patent
Smith et al.

(10) Patent No.: US 8,216,672 B2
(45) Date of Patent: *Jul. 10, 2012

(54) STRUCTURED RESIN SYSTEMS WITH HIGH THERMAL CONDUCTIVITY FILLERS

(75) Inventors: James David Blackhall Smith, Monroeville, PA (US); Gary Stevens, Surrey (GB); John William Wood, Winter Springs, FL (US)

(73) Assignee: Siemens Energy, Inc., Orlando, FL (US)

( * ) Notice: Subject to any disclaimer, the term of this patent is extended or adjusted under 35 U.S.C. 154(b) by 1045 days.

This patent is subject to a terminal disclaimer.

(21) Appl. No.: 11/152,984

(22) Filed: Jun. 14, 2005

(65) Prior Publication Data

US 2005/0277351 A1    Dec. 15, 2005

Related U.S. Application Data

(60) Provisional application No. 60/580,023, filed on Jun. 15, 2004.

(51) Int. Cl.
*B32B 7/12* (2006.01)
*H01L 23/24* (2006.01)
(52) U.S. Cl. ......................................... 428/343; 257/720
(58) Field of Classification Search .................. 428/343; 257/720
See application file for complete search history.

(56) References Cited

U.S. PATENT DOCUMENTS

| | | |
|---|---|---|
| 3,246,271 A | 4/1966 | Ford |
| 3,866,316 A | 2/1975 | Takechi et al. |
| 3,974,302 A | 8/1976 | Croop et al. |
| 4,001,616 A | 1/1977 | Lonseth et al. |
| 4,160,926 A | 7/1979 | Cope et al. |
| 4,335,367 A | 6/1982 | Mitsui et al. |
| 4,361,661 A * | 11/1982 | Jackson ........................ 523/442 |
| 4,400,226 A | 8/1983 | Horrigan |
| 4,427,740 A | 1/1984 | Stackhouse et al. |
| 4,634,911 A | 1/1987 | Studniarz et al. |
| 4,694,064 A | 9/1987 | Tomalia et al. |
| 4,704,322 A | 11/1987 | Roberts |
| 4,760,296 A | 7/1988 | Johnston et al. |
| 4,806,806 A | 2/1989 | Hjortsberg et al. |
| 5,011,872 A | 4/1991 | Latham et al. |
| 5,037,876 A | 8/1991 | Birkle et al. |
| 5,126,192 A | 6/1992 | Chellis et al. |

(Continued)

FOREIGN PATENT DOCUMENTS

EP     0 157 936 A1     10/1985

(Continued)

OTHER PUBLICATIONS

Tari et al., "Impacts on Turbine Generator Design by the Application of Increased Thermal Conducting Stator Insulation" Cigre SC11-01 Meeting, Paper No. 132 (2002).

(Continued)

*Primary Examiner* — Victor Chang

(57) ABSTRACT

In one embodiment the present invention provides for a high thermal conductivity highly structured resin that comprises a host highly structured resin matrix, and a high thermal conductivity filler 30. The high thermal conductivity fillers are from 1-1000 nm in length, and high thermal conductivity fillers have an aspect ratio of between 3-100. Particular highly structured highly structured resins include at least one of liquid crystal 40 polymers, interpenetrating networks, dendrimer type matrices, expanding polymers, ladder polymers, star polymers and structured organic-inorganic hybrids 60.

10 Claims, 4 Drawing Sheets

U.S. PATENT DOCUMENTS

| | | | |
|---|---|---|---|
| 5,281,388 A | 1/1994 | Palmer et al. |
| 5,466,431 A | 11/1995 | Dorfman et al. |
| 5,510,174 A | 4/1996 | Litman |
| 5,540,969 A | 7/1996 | Schuler |
| 5,578,901 A | 11/1996 | Blanchet-Fincher et al. |
| 5,723,920 A | 3/1998 | Markovitz et al. |
| 5,780,119 A | 7/1998 | Dearnaley et al. |
| 5,801,334 A | 9/1998 | Theodorides |
| 5,878,620 A | 3/1999 | Gilbert et al. |
| 5,904,984 A | 5/1999 | Smith et al. |
| 5,938,934 A | 8/1999 | Balogh et al. |
| 5,982,056 A | 11/1999 | Koyama et al. |
| 6,015,597 A | 1/2000 | David |
| 6,048,919 A | 4/2000 | McCullough |
| 6,103,382 A | 8/2000 | Smith et al. |
| 6,130,495 A | 10/2000 | Schulten et al. |
| 6,130,496 A | 10/2000 | Takigawa et al. |
| 6,140,590 A | 10/2000 | Baumann et al. |
| 6,160,042 A | 12/2000 | Ishida |
| 6,190,775 B1 | 2/2001 | Smith et al. |
| 6,238,790 B1 | 5/2001 | Smith et al. |
| 6,251,978 B1 | 6/2001 | McCullough |
| 6,255,738 B1 | 7/2001 | Distefano et al. |
| 6,261,424 B1 | 7/2001 | Goncharenko et al. |
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,344,271 B1 | 2/2002 | Yadav et al. |
| 6,359,232 B1 | 3/2002 | Markovitz et al. |
| 6,393,642 B1 | 5/2002 | Pollman et al. |
| 6,396,864 B1 | 5/2002 | O'Brien et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,548,172 B2 | 4/2003 | David et al. |
| 6,572,937 B2 | 6/2003 | Hakovirta et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 | 4/2006 | Smith |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,425,366 B2 | 9/2008 | Okamoto et al. |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2003/0035960 A1 | 2/2003 | Tsunoda et al. |
| 2003/0040563 A1 | 2/2003 | Sagal et al. |
| 2004/0094325 A1 | 5/2004 | Yoshida et al. |
| 2004/0102597 A1 | 5/2004 | Tobita et al. |
| 2004/0152829 A1 | 8/2004 | Tobita et al. |
| 2004/0241439 A1 | 12/2004 | Morita et al. |
| 2005/0097726 A1 | 5/2005 | Yamamoto et al. |
| 2005/0116336 A1* | 6/2005 | Chopra et al. ............... 257/720 |
| 2005/0161210 A1 | 7/2005 | Zhong et al. |
| 2005/0208301 A1 | 9/2005 | Okamoto et al. |
| 2005/0236606 A1 | 10/2005 | Toas et al. |
| 2005/0245644 A1 | 11/2005 | Smith et al. |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2008/0050580 A1 | 2/2008 | Stevens et al. |
| 2008/0066942 A1 | 3/2008 | Miller |
| 2008/0262128 A1 | 10/2008 | Stevens et al. |

FOREIGN PATENT DOCUMENTS

| | | |
|---|---|---|
| EP | 0 266 602 A1 | 5/1988 |
| EP | 0 394 767 A2 | 10/1990 |
| EP | 0 604 804 A2 | 7/1994 |
| EP | 1 220 240 A1 | 7/2002 |
| EP | 1 300 439 A1 | 4/2003 |
| EP | 1 383 226 A1 | 1/2004 |
| EP | 1 384 567 A1 | 1/2004 |
| EP | 1 486 997 A1 | 12/2004 |
| EP | 1 530 223 A1 | 5/2005 |
| GB | 881036 A2 | 11/1961 |
| JP | 56029305 | 3/1981 |
| JP | 03205443 A | 9/1991 |
| JP | 06313267 A | 11/1994 |
| JP | 10-088201 | 4/1998 |
| JP | 10-211659 | 8/1998 |
| JP | 2002212422 A | 7/2002 |
| JP | 200506389 A | 1/2005 |
| JP | 2005-199562 A | 7/2005 |
| WO | WO 95/02504 A1 | 1/1995 |
| WO | WO 96/28073 A1 | 9/1996 |
| WO | WO 98/41993 A1 | 9/1998 |
| WO | WO 99/26286 A1 | 5/1999 |
| WO | WO 00/56127 A1 | 9/2000 |
| WO | WO 01/68749 A1 | 9/2001 |
| WO | WO 01/84659 A1 | 11/2001 |
| WO | WO 03/040445 A1 | 5/2003 |
| WO | WO 2004/006271 A1 | 1/2004 |
| WO | WO 2004/052999 A2 | 6/2004 |
| WO | WO 2004/067606 A1 | 8/2004 |
| WO | WO 2005/069312 A1 | 7/2005 |
| WO | WO 2005/106089 A2 | 11/2005 |
| WO | WO 2005/123825 A2 | 12/2005 |
| WO | WO 2005/124790 A2 | 12/2005 |
| WO | WO 2006/002014 A1 | 1/2006 |
| WO | WO 2006/007385 A1 | 1/2006 |

OTHER PUBLICATIONS

Sun et al., "Fundamental Research on Surface Modification of Nano-sized Silica for Underfill Applications" 2004 Electronic Components and Technology Conference (2004).

Brutsch et al., "New High Voltage Insulation with Increased Thermal Conductivity" Electrical Electronics Insulation Conference 1993 Proceedings, (Oct. 1993).

Tari et al., "A High Voltage System with Increased Thermal Conductivity for Turbo Generators" Coil Winding, Insulation and Electrical Manufacturing Conference (2001).

Von Roll Isola, "Mica Tapes," product literature, 381.58, date unknown.

Tomoyuki Matsumura "Phase Structures and Thermal and Conductive Properties of Epoxy-Alumina Hybrids Filled with Conductive Fillers," STN Database No. 2002:257918, Apr. 8, 2002, Abstract pp. 1-2; XP-002356007.

Yasufumi Shibata, "Lipophillic Inorganic-Organic Fillers with Low Frictional Coefficient," STN Database No. 2002:568167, Jul. 31, 2002, Abstract pp. 1-3; XP-002355912.

Derwent Acc-No. 1980-39239C (JP 55053802 A Derwent Abstract) (Nippon Mica Seisaku).

Product Data Sheet for Polar Therm Boron Nitride Powder Grades PT120, PT140, PT160, and PT 180, provided by Momentive Performance Materials (2007).

* cited by examiner

STRUCTURED RESIN SYSTEMS WITH HIGH THERMAL CONDUCTIVITY FILLERS

CROSS-REFERENCE TO RELATED APPLICATIONS

This application claims priority to U.S. provisional application No. 60/580,023, filed Jun. 15, 2004, by Smith, et al., which is incorporated herein by reference. This application is further related to U.S. patent application Ser. No. 11/152,983, entitiled "High Thermal Conductivity Materials Incorporated into Resins," now abandoned; U.S. patent application Ser. No. 11/152,985, entitled "High Thermal Conductivity Materials Aligned with Resins"; and U.S. patent application Ser. No. 11/152,986, entitled "High Thermal Conductivity Materials with Grafted Surface Functional Groups," now U.S. Pat. No. 7,781,063, all by Smith et al., all filed Jun. 14, 2005, and all incorporated by reference herein.

FIELD OF THE INVENTION

The field of the invention relates to high thermal conductivity materials impregnated into highly structured resins.

BACKGROUND OF THE INVENTION

With the use of any form of electrical appliance, there is a need to electrically insulate conductors. With the push to continuously reduce the size and to streamline all electrical and electronic systems there is a corresponding need to find better and more compact insulators and insulation systems.

Various epoxy resin materials have been used extensively in electrical insulation systems due to their practical benefit of being tough and flexible electrical insulation materials that can be easily adhered to surfaces. Traditional electrical insulation materials, such as mica flake and glass fiber, can be surface coated and bonded with these epoxy resins, to produce composite materials with increased mechanical strength, chemical resistance and electrical insulating properties. In many cases epoxy resins have replaced traditional varnishes despite such materials having continued use in some high voltage electrical equipment.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene glycol terephthalate mat, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example glass fiber, may be applied to the coil.

Generally, multiple layers of the mica tape 16 are wrapped about the coil with sixteen or more layers generally being used for high voltage coils. Resins are then impregnated into the tape layers. Resins can even be used as insulation independently from the insulating tape. Unfortunately this amount of insulation only further adds to the complications of dissipating heat. What is needed is electrical insulation that can conduct heat higher than that of conventional methods, but that does not compromise the electrical insulation and other performance factors including thermal and mechanical capabilities.

Other difficulties with the prior art also exist, some of which will be apparent upon further reading.

SUMMARY OF THE INVENTION

With the foregoing in mind, methods and apparatuses consistent with the present invention, which inter alia facilitates the transport of phonons through a high thermal conductivity (HTC) impregnated medium to reduce the mean distances between the HTC materials below that of the phonon mean free path length. This reduces the phonon scattering and produces a greater net flow or flux of phonons away from the heat source. The resins may then be impregnated into a host matrix medium, such as a multi-layered insulating tape.

High Thermal Conductivity (HTC) organic-inorganic hybrid materials may be formed from discrete two-phase organic-inorganic composites, from organic-inorganic continuous phase materials based on molecular alloys and from discrete organic-dendrimer composites in which the organic-inorganic interface is non-discrete within the dendrimer core-shell structure. Continuous phase material structures may be formed which enhance phonon transport and reduce phonon scattering by ensuring the length scales of the structural elements are shorter than or commensurate with the phonon distribution responsible for thermal transport, and/or that the number of phonon scattering centers are reduced such as by enhancing the overall structural order of the matrix, and/or by the effective elimination or reduction of interface phonon scattering within the composite. Continuous organic-inorganic hybrids may be formed by incorporating inorganic, organic or organic-inorganic hybrid nano-particles in linear or cross-linked polymers (including thermoplastics) and thermosetting resins in which nano-particles dimensions are of the order of or less than the polymer or network segmental length (typically 1 to 50 nm or greater). These various types of nano-particles will contain reactive surfaces to form intimate covalently bonded hybrid organic-inorganic homogeneous materials. Similar requirements exist for inorganic-organic dendrimers which may be reacted together or with matrix polymers or reactive resins to form a continuous material. In the case of both discrete and non-discrete organic-inorganic hybrids it is possible to use sol-gel chemistry to form a continuous molecular alloy. The resulting materials will exhibit higher thermal conductivity than conventional electrically insulating materials and may be used as bonding resins in conventional mica-glass tape constructions, when utilized as unreacted vacuum-pressure impregnation resins and as stand alone materials to fulfill electrical insulation applications in rotating and static electrical power plant and in both high (approximately over 5 kV) and low voltage (approximately under 5 kV) electrical equipment, components and products.

The formation of engineered electrical insulation materials having prescribed physical properties and performance characteristics, and based on the use of nano-to-micro sized inorganic fillers in the presence of organic host materials, requires the production of particle surfaces which can form an intimate interface with the organic host. This may be achieved through the grafting of chemical groups onto the surface of the fillers to make the surface chemically and physically compatible with the host matrix, or the surfaces may contain chemically reactive functional groups that react with the organic host to form covalent bonds between the particle and the host. The use of nano-to-micro sized inorganic fillers in the presence of organic host materials requires the production of particles with defined surface chemistry in addition to bulk dielectric and electrical properties and thermal conductivity. Most inorganic materials do not allow independent selection of structural characteristics such as shape and size and properties to suit different electrical insulation applications or to achieve composites having the right balance of properties and performance. This may be achieved by selecting particles with appropriate bulk properties and shape and size characteristics and then modifying the surface and interfacial properties and other characteristics to achieve the additional control of composite properties and performance required for electrical insulation applications. This may be achieved by appropriate surface coating of the particles which may include the production of metallic and non-metallic inorganic oxides, nitrides, carbides and mixed systems and organic coatings including reactive surface groups capable of reacting with appropriate organic matrices which act as the host material in the electrical insulation system. The resulting hybrid materials and composites in unreacted or partially reacted form may be used as bonding resins in mica-glass tape constructions, as unreacted vacuum-pressure impregnation resins for conventional mica tape constructions, in other glass fiber, carbon fiber and ply-type and textile composites and as stand alone materials to fulfill electrical insulation applications in rotating and static electrical power plant and in both high and low voltage electrical equipment, components and products.

In one embodiment the present invention provides for a high thermal conductivity highly structured resin that comprises a host highly structured resin matrix, and a high thermal conductivity filler. The high thermal conductivity fillers are from 1-1000 nm in length, and high thermal conductivity fillers have an aspect ratio of between 3-100. Particular highly structured highly structured resins include at least one of liquid crystal polymers, interpenetrating networks, dendrimer type matrices, expanding polymers, ladder polymers, star polymers and structured organic-inorganic hybrids.

In another embodiment the present invention provides for a continuous organic-inorganic highly structured resin that comprises a host highly structured resin network and inorganic high thermal conductivity fillers evenly dispersed in the host highly structured resin network and essentially completely co-reacted with the host highly structured resin network. The high thermal conductivity fillers have a length of between 1-1000 nm and an aspect ratio of 10-50, and the high thermal conductivity fillers are selected from at least one of oxides, nitrides, and carbides. The continuous organic-inorganic highly structured resin comprises a maximum of 60% by volume of the high thermal conductivity fillers. In particular embodiments the high thermal conductivity fillers have been surface treated to introduce surface functional groups that allows for the essentially complete co-reactivity with the host highly structured resin network.

In yet another embodiment the present invention provides for a porous media impregnated with a high thermal conductivity highly structured resin that comprises a porous media and a high thermal conductivity material loaded highly structured resin, the high thermal conductivity material comprises 5-60% by volume of the highly structured resin. The high thermal conductivity materials have aspect ratios of 3-100, and the highly structured resin is at least one of liquid crystal polymers, interpenetrating networks, dendrimer type matrices, expanding polymers, ladder polymers, star polymers and structured organic-inorganic hybrids. In particular embodiments the high thermal conductivity materials comprise at least one of silica, alumina, magnesium oxide, silicon carbide, boron nitride, aluminum nitride, zinc oxide and diamonds and dendrimers of approximately 1-1000 nm in size and have aspect ratios of 10-50.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

Figure 1:
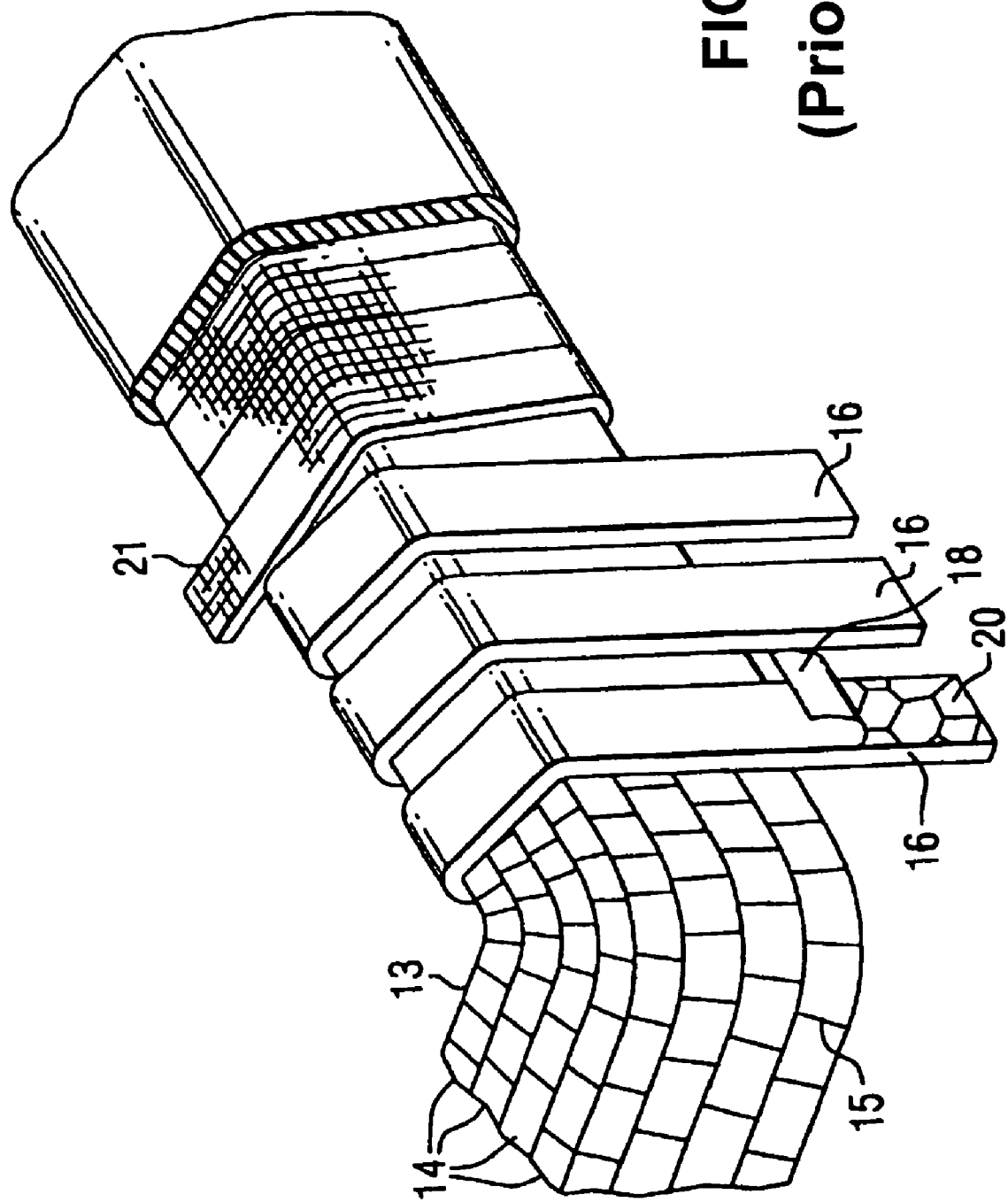
FIG. 1 shows the use of an insulating tape being lapped around a stator coil.

High thermal conductivity (HTC) composites comprise a resinous host network combined with fillers that are two phase organic-inorganic hybrid materials. The organic-inorganic hybrid materials are formed from two phase organic-inorganic composites, from organic-inorganic continuous phase materials that are based on molecular alloys, and from discrete organic-dendrimer composites in which the organic-inorganic interface is non-discrete with the dendrimer core-shell structure. Phonon transport is enhanced and phonon scattering is reduced by ensuring the length scales of the structural elements are shorter than or commensurate with the phonon distribution responsible for thermal transport.

Two phase organic-inorganic hybrids may be formed by incorporating inorganic micro, meso or nano-particles in linear or cross linked polymers (thermoplastics) and thermosetting resins. Host networks include polymers and other types of resins, definitions of which are given below. In general, the resin that acts as a host network may be any resin that is compatible with the particles and, if required, is able to react with the groups introduced at the surface of the filler. Nano-particle dimensions are typically of the order of or less than the polymer network segmental length. For example 1-30 nm. The inorganic particles contain reactive surfaces to form covalently bonded hybrid organic-inorganic homogeneous materials. The particles may be oxides, nitrides, carbides and hybrid stoichiometric and non-stoichiometric mixes of the oxides, nitrides and carbides, more examples of which are given below.

The inorganic particles are surface treated to introduce a variety of surface functional groups which are capable of participating in reactions with the host network. The surface functional groups include but are not limited to hydroxyl, carboxylic, amine, epoxide, silane and vinyl groups. The groups may be applied using wet chemical methods, non-equilibrium plasma methods, chemical vapor and physical vapor deposition, laser beams, sputter ion plating and electron and ion beam evaporation methods.

The discrete organic-dendrimer composites may be reacted together or with the resin matrix to form a single material. The surface of the dendrimer can contain reactive groups similar to those mentioned above, which will either allow dendrimer-dendrimer or dendrimer-organic matrix reactions to occur. The dendrimer will have an inorganic core and an organic shell containing the reactive groups of interest. It may also be possible to have an organic core with an inorganic shell which also contains reactive groups such as hydroxyl or silence groupings which can participate in inorganic reactions similar to those involved in common sol-gel chemistries.

In regards to the use of non-discrete organic-inorganic hybrids it is possible to use sol-gel chemistry to form a continuous molecular alloy. Gel sol-chemistries involving aqueous and non-aqueous reactions may be used. Other compounds for the formation of organic-inorganic hybrids include the polyhedral oligomeric silsesquioxanes (POSS), tetraethyl orthosilicate (TEOS) and tetrabutyl orthotitanate (TBOT) and related monomeric and oligomeric hybrid compounds which are organic functionalized inorganic compounds. In the example of POSS, molecules are built around a building block of $R-SiO_{1.5}$ in which the R group is chosen to compatibilize with and/or react with other organic compounds and the host network. The base compounds may be combined to yield larger molecules commensurate with the size of polymer segment and coil structures. POSS may be used to create organic-inorganic hybrids and may be grafted into existing polymers and networks to control properties, including thermal conductivity. The materials may be obtained from suppliers such as Aldrich™ Chemical Co., Hybrid Plastics™ Inc. and Gelest™ Inc.

As mentioned, it is important to control the structural form of the materials to reduce phonon scattering. This can be further assisted by using nano-particles whose matrices are known to exhibit high thermal conductivity and to ensure that the particles size and its interfacial characteristics with the resin are sufficient to sustain this effect, and also to satisfy the length scale requirement to reduce phonon scattering. A choice of structures that are more highly ordered will also benefit this, including reacted dendrimer lattices having both short and longer range periodicity and ladder or ordered network structures that may be formed from a host resin, such as liquid crystal epoxies and polybutadienes.

The filled resins may be used as bonding resins in a variety of industries such as circuit boards and insulating tapes. A particular kind of insulating tape is the mica-glass tape used in the electrical generator fields. Resins with these types of tapes can be used as bonding resins, or as impregnating resins as is known in the art. The filled resin may also be used in the electrical generator field without the tapes to fulfill electrical insulation applications in the rotating and static electrical equipment components.

The tapes may be impregnated with resin before or after being applied to electrical objects. Resin impregnation techniques include VPI and GVPI, discussed more below. In VPI, once a tape is lapped and impregnated it is compressed. Once in position, the resin in the compressed tape is cured, which effectively locks the position of the HTC materials. In some embodiments the resin is cured in a two stage process, as will be apparent to one of ordinary skill in the art. However, optimal compression of the loaded HTC materials favors a completely uncured resin during the compression stage.

Figure 2:
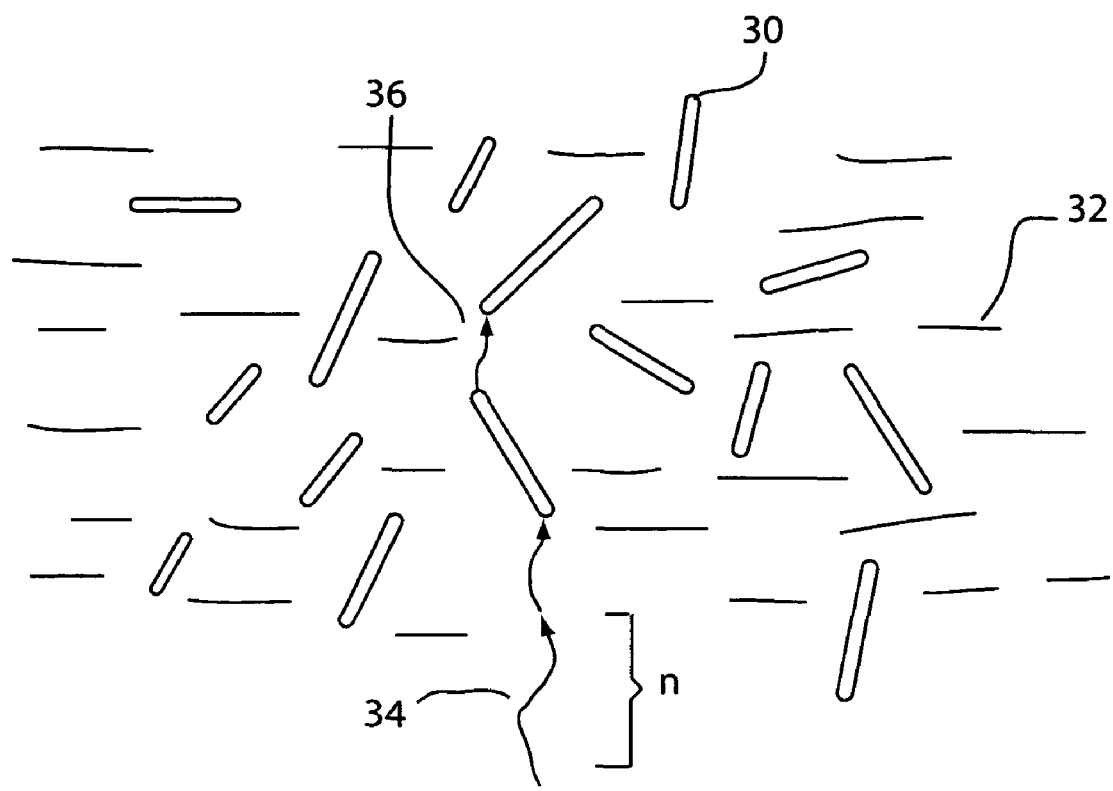
FIG. 2 illustrates phonons traveling through a loaded resin of the present invention.

FIG. 2 shows one embodiment of the present invention. Illustrated here are HTC materials 30 loaded into a resinous matrix 32. Phonons 34 traveling through the matrix have a mean path length n, this is the phonon mean free path. This path length can vary depending on the exact composition of the resin matrix, but is generally from 2 to 100 nm, and more typically 5-50 nm, for resins such as epoxy resins. Therefore the mean distance between the loaded HTC materials should be on average less than this distance. Note that the distance between the HTC materials can vary in the thickness versus transverse direction of the tape, and it is generally the thickness direction where the spacing needs to be optimized.

As phonons 34 travel through the resin 32 they will tend to pass along the embedded HTC materials 30. This will increase the local phonon flux since the raw HTC materials will have a thermal conductivity of between 10-1000 W/mK, as opposed to the resin which is about 0.1-0.5 W/mK. As phonons pass along a loaded HTC material the phonons 36 pass to the next HTC material if the distance between the materials is less than n, therefore the HTC materials form an interconnecting network. FIG. 2 illustrates an idealized path. In practice there will be phonon scattering as the phonons pass between the resin and HTC materials, although the shorter the distance between the materials, and the better the match of phonon propagation characteristics between the HTC materials and the resin, the less the scattering.

The amount of HTC materials loaded in the resin could actually be quite low, for example about 10% as illustrated in FIG. 2. The average distances, or length scales, between loaded HTC materials therefore may be slightly greater than n, however, a large percentage will still be less than n and therefore fall within embodiments of the present invention. In particular embodiment, the percentage materials that are less than n distance from the next HTC material is over 50%, with particular embodiment being over 75%. In particular embodiment the average length of the HTC materials is greater than n, which further aids in phonon transport.

The shorter n the greater the concentration of loaded HTC materials, and conversely, the greater the particle size, the less HTC materials needed. Particular embodiment use 5-60% loaded HTC materials by total volume of the resins and fillers, with more particular embodiments at 25-40%. When the resin is impregnated into the tape, it will fill up the spaces between the tape fibers and substrates. The HTC distribution within the tape at this point, however, is often not optimized, and can even have the mean distance between HTC materials greater than n. Practice of the present invention then compresses the resin impregnated tapes and reduces the distances between the loaded HTC materials.

When a loaded resin is being impregnated into a tape, the fibers or particles of the tape act to block some of the HTC materials, particularly if the resin is 30% or more filler. However, by compressing the tapes, the reverse happens, and more fillers are trapped within the tape as the HTC materials attach themselves to non-mobile parts of the overall structure. The HTC fillers even get pinned to one another. In the embodiments given, it has been implied that the fillers do not react with the resin matrix, however, in some embodiments the fillers do form covalent bonds with the resin and form more homogeneous matrixes. In a homogenous matrix, the resin molecules that are bound to fillers will be retained better than the unbound resin molecules during compression.

Resins are used in a plurality of industries, and have a large number of uses. Different properties of the resins affect not only their uses, but also the quality and efficiency of the products that they are used with. For example, when resins are used in electrical insulation applications, their characteristics of dielectric strength and voltage endurance needs to be high, as does the thermal stability and thermal endurance. However, often contrary to these objectives, resins usually will also have a low thermal conductivity. The present invention balances the various physical properties of resins and the insulation system they are introduced into to produce a system that has a higher thermal conductivity than conventional electrically insulating materials while maintaining adequate, and even enhancing, key physical properties such as dielectric strength, voltage endurance, thermal stability and thermal endurance, mechanical strength and viscoelastic response. Delamination and microvoid formation resulting from stresses caused by thermal and mechanical cycling effects are reduced or eliminated. As used herein, the term resin refers to all resins and epoxy resins, including modified epoxies, polyesters, polyurethanes, polyimides, polyesterimides, polyetherimides, bismaleimides, silicones, polysiloxanes, polybutadienes, cyanate esters, hydrocarbons etc. as well as homogeneous blends of these resins. This definition of resins includes additives such as cross-linking agents, accelerators and other catalysts and processing aids. Certain resins, such as liquid crystal thermosets (LCT) and 1,2 vinyl polybutadiene combine low molecular weights characteristics with good crosslinking properties. The resins can be of an organic matrix, such as hydrocarbons with and without hetero atoms, an inorganic matrix, containing silicate and/or alumino silicate components, and a mixture of an organic and inorganic matrix. Examples of an organic matrix include polymers or reactive thermosetting resins, which if required can react with the reactive groups introduced on inorganic particle surfaces. Cross-linking agents can also be added to the resins to manipulate the structure and segmental length distribution of the final crosslinked network, which can have a positive effect on thermal conductivity. This thermal conductivity enhancement can also be obtained through modifications by other resin additives, such as catalysts, accelerators and other processing aids.

Certain resins, such as liquid crystal thermosets (LCT) and 1,2 vinyl polybutadiene combine low molecular weights characteristics with good crosslinking properties. These types of resins tend to conduct heat better because of enhanced micro and macro ordering of their sub-structure which may lead to enhanced conduction of heat as a result of improved phonon transport. The better the phonon transport, the better the heat transfer.

These types of resins are referred to as highly structured (HS) resins, since they form highly organised micro-structures both prior to and during crosslinking when cured. The structures include crystallinity, para-crystallinity and liquid crystalline structures, unique polymer architectures, controlled crosslinking and network expansion and contraction during cure. The use of HS resins enhances the HTC properties, particularly to heat conductivity and can achieve significant enhancement to electrical and mechanical properties. In addition, the ordering of the HS resins can help to order/align the HTC fillers, which further enhances their physical properties, and can even increase the covalent bonding between the resin matrix and the fillers, because of lower steric hindrance between the resin matrix and the fillers.

Examples of particular types of HS resins fall into seven categories. The liquid crystal polymers discussed above, interpenetrating networks (IPNs), dendrimer type matrices, expanding polymers, ladder polymers, star polymers and structured organic-inorganic hybrids.

Figure 3:
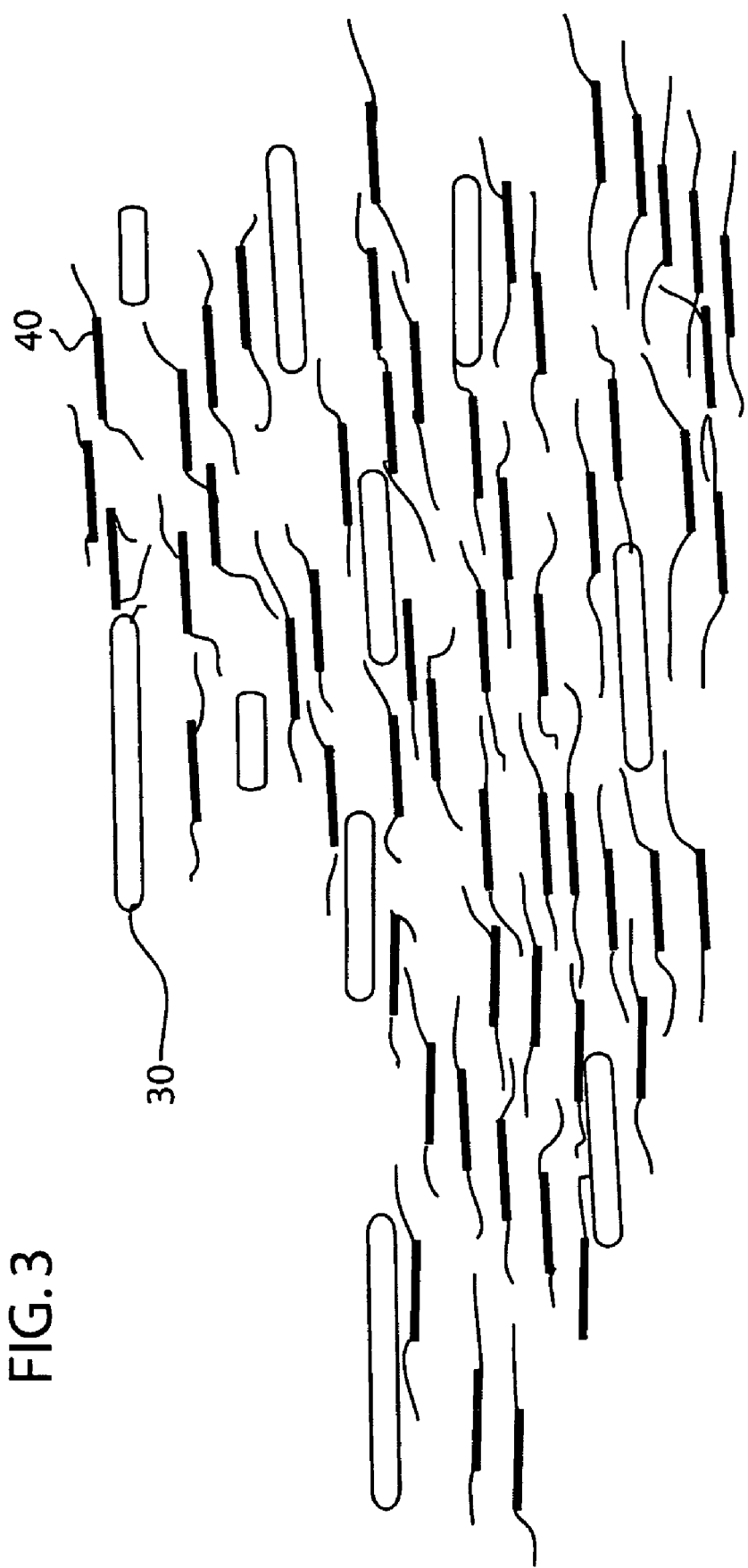
FIG. 3 illustrates HTC fillers aligned within a highly structured liquid crystal resin according to one embodiment of the present invention.

The liquid crystal polymers are a special class of polymer that are typically aromatic polyesters that provide excellent physical properties such as high heat deflection while maintaining other physical characteristics. The liquid crystal polymer structures comprise densely packed, highly crystalline fibrous polymer chains that provide self-reinforcement, even almost up to the melting point of the polymer. Specific examples include Xydar™, which is biphenol based, Vectra™, which is naphthalene based and Zenite™ which is provided by DuPont™. FIG. 3 shows an example of figure the resin 32 is an LCT type resin that forms mesogenic groups 40 that tend to self align on a small scale. The mesogenic groups tend to be from 0.5-100 nm in length, depending on the type of resin, and aggregates of mesogenic groups can be several hundred nanometers long. Aligned within the mesogenic groups are HTC fillers 30. In particular embodiments the mesogenic groups are aligned in concert with the HTC fillers. The alignment of the mesogenic groups can thereby aid in the in the alignment of the fillers groups, creating aligned areas that are thousands of nanometers in length. Conversely, it is also possible for aligned fillers to help align the HS resins.

Interpenetrating Networks (IPN's) are materials containing two polymers, each in network form. Several kinds of IPN architectures exist, such as non-covalent semi-IPN, non-covalent full IPN and covalent semi-IPN. A non-covalent semi-IPN is one in which only one of the polymer systems is cross-linked. A non-covalent full IPN has two separate polymers independently cross-linked. A covalent semi-IPN contains two separate polymer systems that are cross-linked to form a single polymer network. A covalent semi-IPN is similar to a non-covalent IPN because one of the polymer systems can be crosslinked without networking with the second linear system. Thermalastic™ resins are examples of semi-IPN resins in which polystyrene chains are crosslinked with epoxyanhydrides/polyesters. Organic-inorganic covalent IPN materials can incorporate silicon alkoxides along the backbone chain via free radical polymerization through a vinyl functional groups or via condensation with an organic moiety on a silicon alkoxide monomer. These types of IPN can even interact inorganic networks with inorganic fillers.

Figure 4:
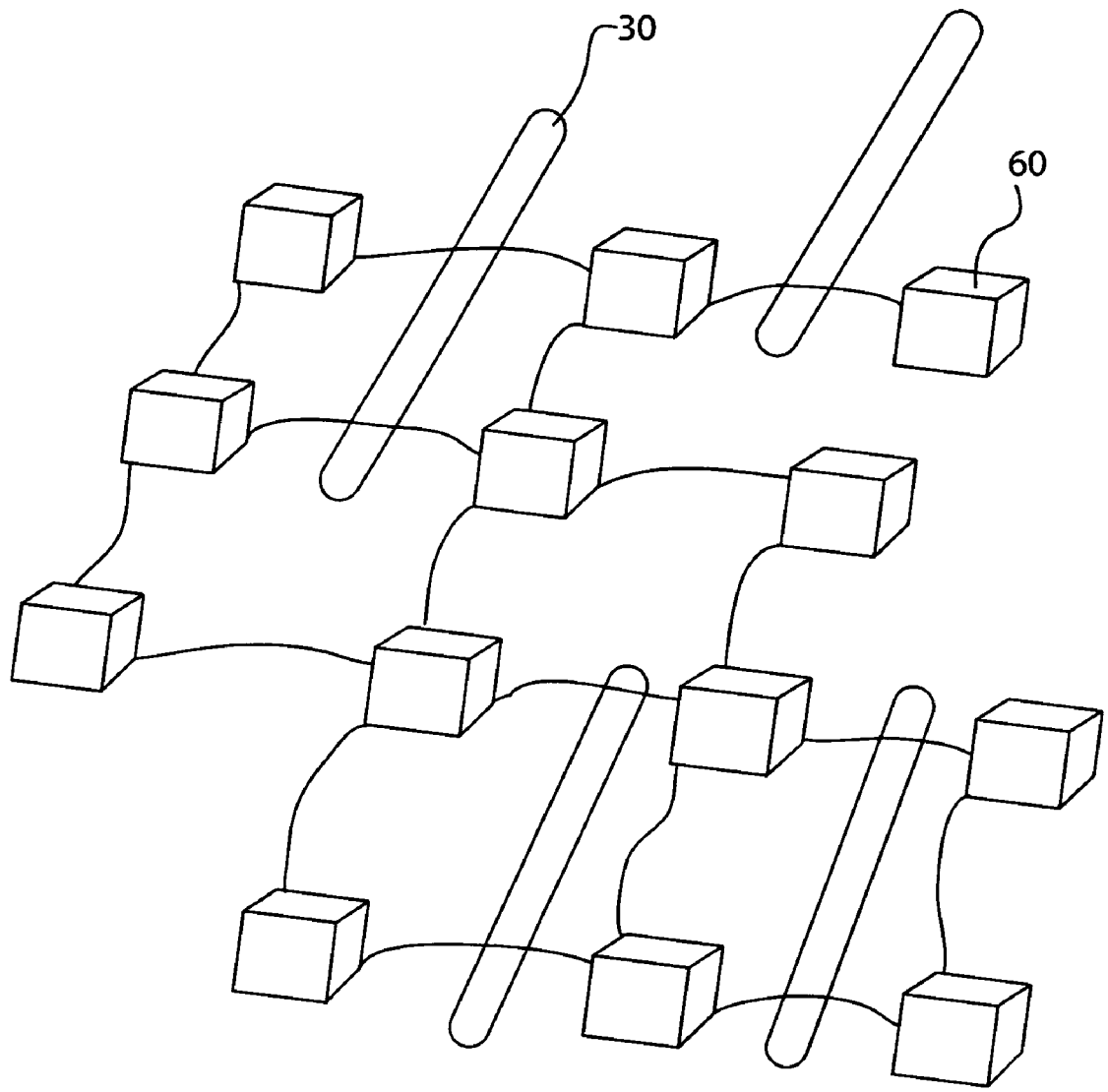
FIG. 4 illustrates HTC fillers aligned within a highly structured POSS resin according to one embodiment of the present invention.

Structured oganic-inorgainc hybrids include the polyhedral oligomeric silsesquioxanes (POSS), tetraethyl orthosilicate (TEOS) and tetrabutyl orthotitanate (TBOT) and related monomeric and oligomeric hybrid compounds discussed above. FIG. 4 shows an example of a POSS network 60 impregnated with HTC fillers 30. Although not specifically illustrated in any of the figures, covalent bonds between the fillers and the host network are possible in some embodiments.

Dendrimer type matrices share similarities to the dendrimer fillers discussed herein, but form the host matrix rather than the filler. The dendrimer polymer comprises a core, and interior area containing many braches or repeating units, called generations, radially connected to the core, and an exterior region of terminal moieties. A dendrimer can be defined into a multitude of structures by fine tuning the architectural components. The surface of the dendrimer can be composed of a large number of functional groups which can be reacted with other polymer species to give unusual copolymer structures. These functional groups include amino, hydroxyl and carboxyl which would be reactive with resins such as the LCT epoxies. Specific types of dendrimers include polypropylene-imine, polyamido-amine, and polyamido-amines with an organic silicon exterior. These types of polymers can also form inorganic networks with the inclusion of inorganic fillers.

Expanding polymers are a class of highly strained cyclic monomers which have the ability to increase in volume as the highly strained cyclic ring opens to polymerize. So the polymer will expand as it cures and not shrink as most resins do. Total volume expansion can be 5-10%. The polymerization mechanism that gives ring opening can be anionic, cationic or free radical, therefore copolymers with epoxy resins and vinyl monomers containing resins are possibilities, due to the similarities of their reaction kinetics. Examples of expanding monomers include spiro, ortho esters, spiro ortho carbonates, cyclic ketene acetals, cyclic vinyl ethers, unsaturated spiro ortho carbonates and unsaturated spiro ortho esters. The expansion phenomena during cure displayed by these types of materials benefits the addition of HTC fillers by causing higher internal compression at the microstructure level, causing increased particle contact, which increases thermal conductivity and electrical voltage endurance. In one embodiment there is present highly strained ring structures responsible for expansion combined with monomer units that are covalently linked to HTC fillers. Although many of the HS resins listed can be mixed with one another, the expanding polymers are particularly suited to be combined with the liquid crystal polymers.

Ladder polymers are highly structured polymers that consist of two main chains or backbones that bond together at regular intervals forming a ladder type structure. A polyimide made from a dianhydride and tetra-amine would be an example of this. Double-stranded ladders occur when a polymer in which the molecules consist of an uninterrupted sequence of rings with adjacent rings having one atom in common (spiro polymer) or two or more atoms in common (ladder polymer).

Star polymers are similar to dendrimers but differ in the way that they are synthesized and in their chemical structures. Star polymers are characterized by a high number of identical-size chains emerging out of a small core. The spherical shape of these polymers and the high order of branching gives star polymers unique properties, such as high compactness and segment density. An example of a particular star polymer would have a divinylbenzene core with polystyrene arm branches. Another example are methacrylate cores with polyethylene branches. The arm lengths can be controlled by the stoichiometric proportions of styrene and the initiator scheme, and the arm number is regulated by the stoichiometric quantity of divinylbenze.

When the high thermal conductivity fillers of the present invention are mixed with resins they form a continuous product, in that there is no interface between the resins and the fillers. In some cases, covalent bonds are formed between the fillers and the resin. However, continuous is somewhat subjective and depends on the scale to which the observer is using. On the macro-scale the product is continuous, but on the nano-scale there can still be distinct phases between the fillers and the resin network. Therefore, when referring high thermal conductivity fillers mixing with the resin, they form a continuous organic-inorganic composite, on the macro-scale, while on the micro-scale the same mixture can be referred to as a hybrid.

As mentioned, filled resin may be used in the electrical generator field without the tapes to fulfill electrical insulation applications in the rotating and static electrical equipment components. The use of high thermal conductivity materials in a generator is multiple. Within the stator coil there are component materials other than the groundwall which must have high thermal conductivity to optimize the design. Likewise other components associated with the coils to maximize heat removal. Improvements to stator design dictate that improvements be made to rotor design so that generator efficiency can by maximized.

One embodiment of the present invention adds high thermal conductivity (HTC) materials to resins to improve the thermal conductivity of the resins. In some embodiments the other physical properties of the resins are reduced in a trade-off with higher thermal conductivity, but in other embodiments, some of the other physical properties will not be significantly affected, and in some particular embodiments these other properties will be improved. In particular embodiments, the HTC materials are added to resins, such as LCT epoxy, that have ordered sub-structures. When added to these types of resins, the amount of HTC material used can be reduced versus use in resins without ordered sub-structures.

The HTC materials loaded into the resins are of a variety of substances that can be added so that they may physically and/or chemically interact with or react with the resins to improve thermal conductivity. In one embodiment, the HTC materials are dendrimers, and in another embodiment they are nano or micro inorganic fillers having a defined size or shape including high aspect ratio particles with aspect ratios (ratio mean lateral dimension to mean longitudinal dimension) of 3 to 100 or more, with a more particular range of 10-50.

In a related embodiment, the HTC materials may have a defined size and shape distribution. In both cases the concentration and relative concentration of the filler particles is chosen to enable a bulk connecting (or so-called percolation) structure to be achieved which confers high thermal conductivity with and without volume filling to achieve a structurally stable discrete two phase composite with enhanced thermal conductivity. In another related embodiment, the orientation of the HTC materials increases thermal conductivity. In still another embodiment, the surface coating of the HTC materials enhances phonon transport. These embodiments may stand apart from other embodiments, or be integrally related. For example, dendrimers are combined with other types of highly structured materials such as thermoset and thermoplastic materials. They are uniformly distributed through a resin matrix such that the HTC materials reduce phonon scattering and provide micro-scale bridges for phonons to produce good thermally conducting interfaces between the HTC materials. The highly structured materials are aligned so that thermal conductivity is increased along a single direction or directions to produce either localized or bulk anisotropic electrically insulating materials. In another embodiment HTC is achieved by surface coating of lower thermal conductivity fillers with metal oxides, carbides or nitrides and mixed systems having high thermal conductivity which are physically or chemically attached to fillers having defined bulk properties, such attachment being achieved by processes such as chemical vapour deposition and physical vapour deposition and also by plasma treatment.

In related embodiments, the HTC materials form essentially homogenous mixtures with the resins, essentially free of undesired microscopic interfaces, variable particle wetting and micro void formation. These homogeneous materials form a continuous-phase material which are non-discrete at length scales shorter than either the phonon wavelength or phonon mean free path in conventional electrical insulating materials. In some embodiments, intentional interfaces can be placed in the resin structure so as to control dielectric breakdown. In insulating materials, dielectric breakdown will occur given the right conditions. By controlling the nature and spatial distribution of the interfaces in two-phase system, dielectric breakdown strength and long term electrical endurance can be enhanced. Increases in dielectric strength will take place in part because of increased densification, the removal of micro voids and a higher level of internal mechanical compression strength.

Resins of the present invention may be used for impregnation of other composite constructions such as a mica tape and glass and polyester tape. In addition to the standard mica (Muscovite,Phlogopite) that is typically used for electrical insulation there is also Biotite mica as well as several other mica-like Alumino-Silicate materials such as Kaolinite, Halloysite, Montmorillonite and Chlorite. Montmorillonite has lattices in its structure which can be readily intercalated with polymer resins, metal cations and nano particles to give high dielectric strength composites.

In other embodiments, the present invention is used as a continuous coating on surfaces where insulation is desired; note that "continuous coating" is a description of a macro-scale application. In a continuous coating, the resin forms a coating on materials without the need for a tape or other substrate. When used with a substrate, the HTC materials can be combined with the resin by a variety of different methods. For example, they can be added prior to the resin being added to the substrate, or the HTC materials can be added to the substrate before the resin is impregnated thereon, or the resin can be added first, followed by the HTC material and then an additional impregnation of resin. Other fabrication and process methods will be apparent to one of ordinary skill in the art.

In one embodiment the present invention uses novel organic-inorganic materials which offer-higher thermal conductivity and also maintain or enhance other key properties and performance characteristics. Such materials have applications in other high voltage and low voltage electrical insulation situations where high thermal conductivity confers advantage in terms of enhanced power rating, reduced insulation thickness, more compact electrical designs and high heat transfer. The present invention adds nano, meso, and micro inorganic HTC-materials such as alumina, magnesium oxide, silicon carbide, boron nitride, aluminium nitride, zinc oxide and diamond, as well as others, to give higher thermal conductivity. These materials can have a variety of crystallographic and morphological forms and they may be processed with the matrix materials either directly or via a solvent which acts as a carrier liquid. The solvent mixture may be used to mix the HTC-materials into the matrix to various substrates such as mica-tape. In contrast, molecular hybrid materials which form another embodiment of the present invention, do not contain discrete interfaces, and have the advantages conferred by an inorganic phase within an organic. These materials may also confer enhancement to other physical properties such as thermal stability, tensile strength, flexural strength, and impact strength, variable frequency and temperature dependant mechanical moduli and loss and general viscoelastic response, etc.

In another embodiment, the present invention comprises discrete organic-dendrimer composites in which the organic-inorganic interface is non-discrete with a dendrimer core-shell structure. Dendrimers are a class of three-dimensional nanoscale, core-shell structures that build on a central core. The core may be of an organic or inorganic material. By building on a central core, the dendrimers are formed by a sequential addition of concentric shells. The shells comprise branched molecular groups, and reach branched shell is referred to as a generation. Typically, the number of generations used is from 1-10, and the number of molecular groups in the outer shell increase exponentially with the generation. The composition of the molecular groups can be precisely synthesized and the outer groupings may be reactive functional groups. Dendrimers are capable of linking with a resin matrix, as well as with each other. Therefore, they may be added to a resin as an HTC material, or, in other embodiments, may form the matrix themselves without being added to traditional resins.

The molecular groups can be chosen for their ability to react, either with each other or with a resin. However, in other embodiments, the core structure of the dendrimers will be selected for their own ability to aid in thermal conductivity; for example, metal oxides as discussed below.

Generally, the larger the dendrimer, the greater its ability to function as a phonon transport element. However, its ability to permeate the material and its percolation potential can be adversely affected by its size so optimal sizes are sought to achieve the balance of structure and properties required. Like other HTC materials, solvents can be added to the dendrimers so as to aid in their impregnation of a substrate, such as a mica or a glass tape. In many embodiments, dendrimers will be used with a variety of generations with a variety of different molecular groups.

Commercially available organic Dendrimer polymers include Polyamido-amine Dendrimers (PAMAM) and Polypropylene-imine Dendrimers (PPI) and PAMAM-OS which is a dendrimer with a PAMAM interior structure and organo-silicon exterior. The former two are available from Aldrich Chemical™ and the last one from Dow-Corning™.

Similar requirements exist for inorganic-organic dendrimers which may be reacted together or with matrix polymers or reactive resins to form a single material. In this case the surface of the dendrimer could contain reactive groups similar to those specified above which will either allow dendrimer-dendrimer, dendrimer-organic, dendrimer-hybrid, and dendrimer-HTC matrix reactions to occur. In this case the dendrimer will have an inorganic core and an organic shell, or vice-versa containing either organic or inorganic reactive groups or ligands of interest. It is therefore also possible to have an organic core with an inorganic shell which also contains reactive groups such as hydroxyl, silanol, vinyl-silane, epoxy-silane and other groupings which can participate in inorganic reactions similar to those involved in common sol-gel chemistries.

In all cases phonon transport is enhanced and phonon scattering reduced by ensuring the length scales of the structural elements are shorter than or commensurate with the phonon distribution responsible for thermal transport. Larger HTC particulate materials can actually increase phonon transport in their own right, however, smaller HTC materials can alter the nature of the resin matrix, thereby affect a change on the phonon scattering. This may be further assisted by using nano-particles whose matrices are known to exhibit high thermal conductivity and to ensure that the particle size and interface characteristics are sufficient to sustain this effect and also to satisfy the length scale requirements for reduced phonon scattering. It is also necessary to consider the choice of structures that are more highly ordered including reacted dendrimer lattices having both short and longer range periodicity and ladder or ordered network structures that may be formed from matrices such as liquid crystal epoxy resins and polybutadienes. A resin matrix of the prior art will have a maximum thermal conductivity of about 0.15 W/mK. The present invention provides resins with a thermal conductivity of 0.5 to 5 W/mK and even greater.

Continuous organic-inorganic hybrids may be formed by incorporating inorganic nano-particles in linear or crosslinked polymers and thermosetting resins in which nano-particles dimensions are of the order of or less than the polymer or network segmental length (typically 1 to 50 nm).

This would include, but is not exclusive to three routes or mechanisms by which this can occur (i) side chain grafting, (ii) inclusive grafting e.g. between two polymer chain ends, (iii) cross-link grafting involving at least two and typically several polymer molecules. These inorganic nano-particles will contain reactive surfaces to form intimate covalently bonded hybrid organic-inorganic homogeneous materials. These nano-particles may be metal oxides, metal nitrides, and metal carbides, as well as some non-metal oxides, nitrides and carbides. For example, alumina, magnesium oxide and zinc oxide and other metal oxides, boron nitride and aluminum nitride and other metal nitrides, silicon carbide and other carbides, diamond of natural or synthetic origin, and any of the various physical forms of each type and other metal carbides and hybrid stoichiometric and non-stoichiometric mixed oxides, nitrides and carbides. More specific examples of these include $Al_2O_3$, AlN, MgO, ZnO, BeO, BN, $Si_3N_4$, SiC and $SiO_2$ with mixed stoichiometric and non-stoichiometric combinations. Further, these nano-particles will be surface treated to introduce a variety of surface functional groups which are capable of participating in reactions with the host organic polymer or network. It is also possible to coat non-HTC materials, such as silica and other bulk filler materials, with an HTC material. This may be an option when more expensive HTC materials are used.

The volume percentage of the HTC materials in the resin may be up to approximately 60% or more by volume, and more particularly up to approximately 35% by volume. Higher volume filling tends to give higher structural stability to a matrix. However, with control of the size and shape distribution, degree of particle association and alignment the HTC materials can occupy as little as 1% by volume or less. Although, for structural stability reasons, it might be useful to add an amount greater than the minimum needed for percolation to occur. Therefore the resin can withstand physical strains and deformation without damaging the percolation structure and the HTC characteristics.

The addition of surface functional groups may include hydroxyl, carboxylic, amine, epoxide, silane or vinyl groups which will be available for chemical reaction with the host organic polymer or network forming resin system. These functional groups may be naturally present on the surface of inorganic fillers or they may be applied using wet chemical methods, non-equilibrium plasma deposition including plasma polymerization, chemical vapour and physical vapour deposition, laser beams, sputter ion plating and electron and ion beam evaporation methods. The matrix polymer or reactive resin may be any system which is compatible with the nano-particles and, if required, is able to react with the reactive groups introduced at the nano-particle surface. These may be epoxy, polyimide epoxy, liquid crystal epoxy, cyanate-ester and other low molecular weight polymers and resins with a variety of crosslinking agents.

In the case of non-discrete organic-inorganic hybrids it is possible to use sol-gel chemistry to form a continuous molecular alloy. In this case sol-gel chemistries involving aqueous and non-aqueous reactions may be considered.

The products of the present invention exhibit higher thermal conductivity than conventional electrically insulating materials and may be used as bonding resins in mica-glass tape constructions, as unreacted vacuum-pressure impregnation resins for conventional mica tape constructions and as stand alone materials to fulfill electrical insulation applications in rotating and static electrical power plant and in both high and low voltage electrical and electronic equipment, components and products. Products of the present invention may be combined with each other, as well as HTC-material, and other materials, of the prior art.

Micro and nano HTC particles may be selected on their ability to self aggregate into desired structural, filaments and branched dendrites. Particles may be selected for their ability to self-assemble naturally, though this process may also be modified by external forces such as an electric field, magnetic field, sonics, ultra-sonics, pH control, use of surfactants and other methods to affect a change to the particle surface charge state, including charge distribution, of the particle. In a particular embodiment, particles such as boron nitride, aluminum nitride, diamond are made to self assemble into desired shapes. In this manner, the desired aggregation structures can be made from highly thermally conductive materials at the outset or assembled during incorporation into the host matrix.

In many embodiments, the size and shape of the HTC-materials are varied within the same use. Ranges of size and shape are used in the same product. A variety of long and shorter variable aspect ratio HTC-materials will enhance the thermal conductivity of a resin matrix, as well as potentially provide enhanced physical properties and performance. One aspect that should be observed, however, is that the particle length does not get so long as to cause bridging between layers of substrate/insulation. Also, a variety of shapes and length will improve the percolation stability of the HTC-materials by providing a more uniform volume filing and packing density, resulting in a more homogeneous matrix. When mixing size and shapes, in one embodiment the longer particles are more rod-shaped, while the smaller particles are more spheroidal, platelet or discoid and even cuboids. For example a resin containing HTC-materials could contain about 55-65% by volume 10-50 nm diameter spheroids and about 15-25% by volume 10-50 μm length rods, with 10-30% volume resin.

In another embodiment the present invention provides for new electrical insulation materials based on organic-inorganic composites. The thermal conductivity is optimized without detrimentally affecting other insulation properties such as dielectric properties (permittivity and dielectric loss), electrical conductivity, electric strength and voltage endurance, thermal stability, tensile modulus, flexural modulus, impact strength and thermal endurance in addition to other factors such as viscoelastic characteristics and coefficient of thermal expansion, and overall insulation. Organic and inorganic phases are constructed and are selected to achieve an appropriate balance of properties and performance.

In one embodiment the surface coating of nano, meso and micro inorganic fillers having the desired shape and size distribution and the selected surface characteristics and bulk filler properties are complimentary to each other. This enables the percolation structure of the filler phase in the organic host and the interconnection properties to be controlled independently while maintaining required bulk properties. In addition organic and inorganic coatings, as singular or secondary coatings may be used to ensure compatibilisation of the particle surfaces with the organic matrix and allow chemical reactions to occur with the host organic matrix.

In regards to shape, the present invention utilizes individual particle shapes tending towards natural rods and platelets for enhanced percolation, with rods being the most preferred embodiment including synthetically processed materials in addition to those naturally formed. A rod is defined as a particle with a mean aspect ratio of approximately 5 or greater, with particular embodiments of 10 or greater, though with more particular embodiments of no greater than 100. In one embodiment, the axial length of the rods is approximately in the range 10 nm to 100 microns.

Smaller rods will percolate a resin matrix better, and have less adverse effect on the viscosity of the resin.

Many micro and nano particles form spheroidal and discoid shapes, which have reduced ability to distribute evenly under certain conditions and so may lead to aggregated filamentary structures that reduce the concentration at which percolation occurs. By increasing the percolation, the thermal properties of the resin can be increased, or alternately, the amount of HTC material that needs to be added to the resin can be reduced. Also, the enhanced percolation results in a more even distribution of the HTC materials within the resin rather than agglomeration which is to be avoided, creating a more homogenous product that is less likely to have undesired interfaces, incomplete particle wetting and micro-void formation. Likewise aggregated filamentary or dendritic structures, rather than globular (dense) aggregates or agglomerates, formed from higher aspect ratio particles confer enhanced thermal conductivity.

Additionally, fluid flow fields and electric and magnetic fields can be applied to the HTC materials to distribute and structurally organize them inside of the epoxy resin. By using alternating or static electric fields, the rod and platelet shapes can be aligned on a micro-scale. This creates a material that has different thermal properties in different directions. The creation of an electric field may be accomplished by a variety of techniques known in the art, such as by attaching electrodes across an insulated electrical conductor or by use of a conductor in the centre of a material or the insulation system.

Organic surface coatings, and inorganic surface coatings such as, metal-oxide, -nitride, -carbide and mixed systems may be generated which, when combined with the selected particle size and shape distribution, provide a defined percolation structure with control of the bulk thermal and electrical conductivity of the insulation system while the particle permittivity may be chosen to control the permittivity of the system. Another type of coating is micro-particulate and nano-particulate diamond coatings and of natural or synthetic origin. In poly-crystalline and mono-crystalline nano-particulate form, the particles may associate with the surface of a carrier particle, eg silica. Silica by itself is not a strong thermally conducting material, but with the addition of a surface coating it becomes more of a higher thermal conductivity material. Silica and other such materials, however, have beneficial properties such as being readily formed into rod-shaped particles, as discussed above. In this manner, various HTC properties can be combined into one product. These coatings may also have application to mica tape structures, including both the mica and the glass components, with or without resin impregnation.

Reactive surface functional groups may be formed from surface groups intrinsic to the inorganic coating or may be achieved by applying additional organic coatings both of which may include hydroxyl, carboxylic, amine, epoxide, silane, vinyl and other groups which will be available for chemical reaction with the host organic matrix. These single or multiple surface coatings and the surface functional groups may be applied using wet chemical methods, non-equilibrium plasma methods including plasma polymerization and chemical vapour and physical vapour deposition, laser beams, sputter ion plating and electron and ion beam evaporation methods.

In another embodiment the present invention provides for new electrical insulation systems based on organic-inorganic composites. The interface between the various inorganic and organic components is made to be chemically and physically intimate to ensure a high degree of physical continuity between the different phases and to provide interfaces which are mechanically strong and not prone to failure during the operation of the electrical insulation system in service in both high and low voltage applications. Such materials have applications in high voltage and low voltage electrical insulation situations where enhanced interfacial integrity would confer advantage in terms of enhanced power rating, higher voltage stressing of the insulation systems, reduced insulation thickness and would achieve high heat transfer.

A particular embodiment uses a variety of surface treatments, nano, meso and micro inorganic fillers, so as to introduce a variety of surface functional groups which are capable of compatibilizing the inorganic surface with respect to the organic matrix or to allow chemical reactions to occur with the host organic matrix. These surface functional groups may include hydroxyl, carboxylic, amine, epoxide, silane or vinyl groups which will be available for chemical reaction with the host organic matrix. These functional groups may be applied using wet chemical methods, non-equilibrium plasma methods, chemical vapour and physical vapour deposition, laser beams, sputter ion plating and electron and ion beam evaporation methods.

In many embodiments, the surface treated materials may be used in bonding resins in mica-glass tape constructions, in unreacted vacuum-pressure impregnation (GVPI & VPI) resins for conventional mica tape constructions and in stand alone electrical insulation coatings or bulk materials to fulfill either electrically insulating or conducting applications in rotating and static electrical power plant and in both high and low voltage electrical equipment, components and products. Also, all chemical reactions should be the result of addition, and not condensation reactions so as to avoid volatile by-products.

Improvements in epoxy resins have recently been made by using liquid crystal polymers. By mixing an epoxy resin with a liquid crystal monomer or by incorporating a liquid crystalline mesogen into an epoxy resin molecule such as DGEBA, a liquid crystal thermoset (LCT) epoxy resin is produced that contains polymers or monomers that can be cross-linked to form ordered networks having significantly improved mechanical properties. See U.S. Pat. No. 5,904,984, which is incorporated herein by reference. A further benefit of LCTs is that they also have improved thermal conductivity over standard epoxy resins, and lower coefficient of thermal expansion (CTE) values as well.

What makes LCT epoxy resins even more appealing is that they are also better able to conduct heat than a standard epoxy resin. U.S. Pat. No. 6,261,481, which is incorporated herein by reference, teaches that LCT epoxy resins can be produced with a thermal conductivity greater than that of conventional epoxy resins. For example, a standard Bisphenol A epoxy is shown to have thermal conductivity values of 0.18 to 0.24 wafts per meter degree Kelvin (W/mK) in both the transverse (plane) and thickness direction. By contrast, an LCT epoxy resin is shown to have a thermal conductivity value, when used in practical applications, of no more than 0.4 W/mK in the transverse direction and up to 0.9 W/mK in the thickness direction.

As used in reference to HTC materials being applied to paper, the term substrate refers to the host material that the insulating paper is formed from, while paper matrix refers to the more complete paper component made out of the substrate. These two terms may be used somewhat interchangeable when discussing this embodiment of the present invention. The increase of thermal conductivity should be accomplished without significantly impairing the electrical properties, such as dissipation factor, or the physical properties of the substrate, such as tensile strength and cohesive properties. The physical properties can even be improved in some embodiments, such as with surface coatings. In addition, in some embodiments the electrical resistivity of the host paper matrix can also be enhanced by the addition of HTC materials.

In addition to the standard mica (Muscovite,Phlogopite) that is typically used for electrical insulation there is also Biotite mica as well as several other Mica-like Alumino-Silicate materials such as Kaolinite, Halloysite, Montmorillonite and Chlorite. Montmorillonite has lattices in its structure which can be readily intercalated with HTC materials such as metal cations, organic compounds and monomers and polymers to give high dielectric strength composites.

Insulating papers are just one type of porous media that may be impregnated with the resin of the present invention. Many other materials and components made therefrom, in many industries, some of which are mentioned below, can use different types of porous media to impregnate the resin into. By way of examples there are glass fiber matrix or fabric, and polymer matrix or fabric, where the fabric might typically be cloth, malt, or felt. Circuit boards, which are glass fabric laminate, with planar lamination, will be one product which will benefit from the use of resins of the present invention.

Types of resin impregnation used with stator coils are known as VPI and GVPI. Tape is wrapped around the coil and then impregnated with low viscosity liquid insulation resin by vacuum-pressure impregnation (VPI). That process consists of evacuating a chamber containing the coil in order to remove air and moisture trapped in the mica tape, then introducing the insulation resin under pressure to impregnate the mica tape completely with resin thus eliminating voids, producing resinous insulation in a mica host. A compression of about 20% is particular to the VPI process in some embodiments. After this is completed, the coils are heated to cure the resin. The resin may contain an accelerator or the tape may have one in it. A variation of this, global VPI (GVPI) involves the process where dry insulated coils are wound, and then the whole stator is vacuum pressure impregnated rather than the individual coils. In the GVPI process, the coils are compressed prior to impregnation with the resin since the dry coils are inserted into their final position prior to impregnation. Although various compression methods have been discussed above, it is also possible to use the VPI/GVPI impregnating process for the actual compression stage of the present invention.

In one embodiment the present invention provides for a high thermal conductivity highly structured resin that comprises a host highly structured resin matrix, and a high thermal conductivity filler. The high thermal conductivity fillers are from 1-1000 nm in length, and high thermal conductivity fillers have an aspect ratio of between 3-100. Particular highly structured highly structured resins include at least one of liquid crystal polymers, interpenetrating networks, dendrimer type matrices, expanding polymers, ladder polymers, star polymers and structured organic-inorganic hybrids.

In a related embodiment, the high thermal conductivity filler forms a continuous organic-inorganic composite with the host highly structured resin matrix. And in another related embodiment the high thermal conductivity fillers have an aspect ratio of between 10-50.

In another embodiment the present invention provides for a continuous organic-inorganic highly structured resin that comprises a host highly structured resin network and inorganic high thermal conductivity fillers evenly dispersed in the host highly structured resin network and essentially completely co-reacted with the host highly structured resin network. The high thermal conductivity fillers have a length of between 1-1000 nm and an aspect ratio of 10-50, and the high thermal conductivity fillers are selected from at least one of oxides, nitrides, and carbides. The continuous organic-inorganic highly structured resin comprises a maximum of 60% by volume of the high thermal conductivity fillers. In particular embodiments the high thermal conductivity fillers have been surface treated to introduce surface functional groups that allows for the essentially complete co-reactivity with the host highly structured resin network.

In a related embodiments the oxides, nitrides, and carbides comprise Al2O3, AlN, MgO, ZnO, BeO, BN, Si3N4, SiC and SiO2 with mixed stoichiometric and non-stoichiometric combinations. The functional groups comprise at least one of hydroxyl, carboxylic, amine, epoxide, silane and vinyl groups. The continuous organic-inorganic highly structured resin comprises a maximum of 35% by volume of the high thermal conductivity fillers.

In other related embodiments the host highly structured resin network includes epoxy, polyimide epoxy, liquid crystal epoxy and cyanate-ester. The continuous organic-inorganic highly structured resin further comprises a cross-linking agent. The continuous organic-inorganic highly structured resin is impregnated into a porous media.

In yet another embodiment the present invention provides for a porous media impregnated with a high thermal conductivity highly structured resin that comprises a porous media and a high thermal conductivity material loaded highly structured resin, the high thermal conductivity material comprises 5-60% by volume of the highly structured resin. The high thermal conductivity materials have aspect ratios of 3-100, and the highly structured resin is at least one of liquid crystal polymers, interpenetrating networks, dendrimer type matrices, expanding polymers, ladder polymers, star polymers and structured organic-inorganic hybrids. In particular embodiments the high thermal conductivity materials comprise at least one of silica, alumina, magnesium oxide, silicon carbide, boron nitride, aluminum nitride, zinc oxide and diamonds and dendrimers of approximately 1-1000 nm in size and have aspect ratios of 10-50.

In particular embodiments the high thermal conductivity material comprises 25-40% by volume of the, highly structured resin. The porous media is a paper matrix, such as a mica-glass insulating paper. Other types of porous media include circuit boards and cloth mats and felt.

Although the present invention has been discussed primarily in use with electrical industries, the invention is equally applicable in other areas. Industries that need to increase heat transference would equally benefit from the present invention. For example, the energy, chemical, process and manufacturing industries, inclusive of oil and gas, and the automotive and aerospace industries. Other focuses of the present invention include power electronics, conventional electronics, and integrated circuits where the increasing requirement for enhanced density of components leads to the need to remove heat efficiently in local and large areas. Also, while specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

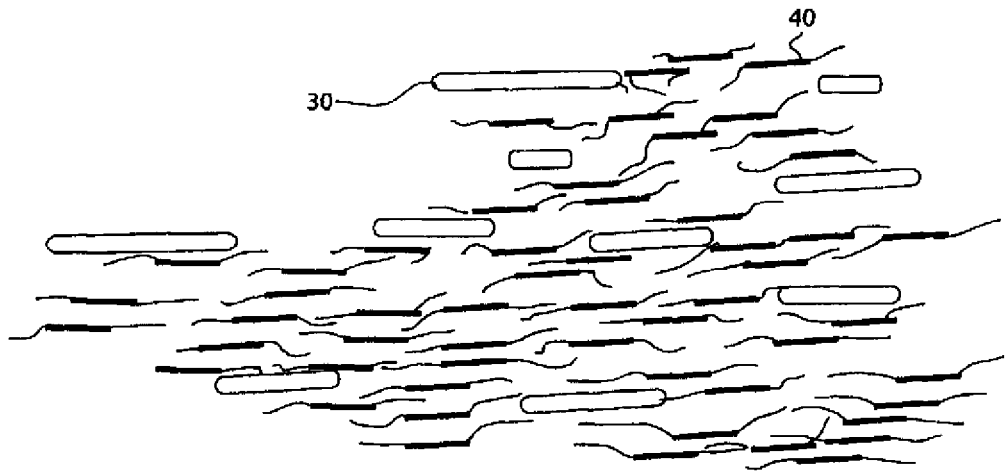

What is claimed is:

1. A continuous organic-inorganic highly structured resin comprising:

a host highly structured resin network comprising a plurality of mesogenic groups; and inorganic high thermal conductivity fillers being evenly dispersed in said host highly structured resin network, wherein said inorganic high thermal conductivity fillers comprise surface functional groups that covalently bond said high thermal conductivity fillers directly to said host highly structured resin network;

wherein said high thermal conductivity fillers have a length of between 1-1000 nm and an aspect ratio of 10-50;

wherein said plurality of mesogenic groups and said thermal conductivity fillers are in substantial alignment with one another in a uniform direction; and wherein the continuous organic-inorganic highly structured resin comprises minimal to no interfacial gaps or microvoids formed therein and is effective to reduce an amount of phonon scattering and to increase an amount of phonon transport in the resin.

2. The continuous organic-inorganic highly structured resin of claim 1, wherein said functional groups comprise at least one of hydroxyl, carboxylic, amine, epoxide, silane or vinyl groups.

3. The continuous organic-inorganic highly structured resin of claim 1, wherein said host highly structured resin network comprises at least one of epoxy, polyimide epoxy, liquid crystal epoxy or cyanate-ester.

4. The continuous organic-inorganic highly structured resin of claim 1, wherein host highly structured resin network comprises liquid crystal polymers.

5. The continuous organic-inorganic highly structured resin of claim 1, wherein the plurality of mesogenic groups are from 0.5-100 nm in length.

6. The continuous organic-inorganic highly structured resin of claim 1, wherein said high thermal conductivity fillers are selected from at least one of oxides, nitrides, or carbides.

7. The continuous organic-inorganic highly structured resin of claim 6, wherein said at least one of said oxides, nitrides, and carbides comprise at least one of $Al_2O_3$, AlN, MgO, ZnO, BeO, BN, $Si_3N_4$, SiC or $SiO_2$ with mixed stoichiometric and non-stoichiometric combinations.

8. The continuous organic-inorganic highly structured resin of claim 1, wherein said continuous organic-inorganic structured resin comprises a maximum of 60% by volume of said high thermal conductivity fillers.

9. The continuous organic-inorganic highly structured resin of claim 8, wherein said continuous organic-inorganic highly structured resin comprises a maximum of 35% by volume of said high thermal conductivity fillers.

10. The continuous organic-inorganic highly structured resin of claim 8, wherein said high thermal conductivity fillers have a dimension of from 1 to 50 nm that is of the order or less than a polymer or segmental length of said host highly structured resin network.

* * * * *

UNITED STATES PATENT AND TRADEMARK OFFICE
CERTIFICATE OF CORRECTION

| | | |
|---|---|---|
| PATENT NO. | : 8,216,672 B2 | Page 1 of 1 |
| APPLICATION NO. | : 11/152984 | |
| DATED | : July 10, 2012 | |
| INVENTOR(S) | : James David Blackhall Smith, Gary Stevens and John William Wood | |

It is certified that error appears in the above-identified patent and that said Letters Patent is hereby corrected as shown below:

Col. 20, line 26, add claim 11 as follows: --11. An impregnated porous media comprising an insulating paper impregnated with the continuous high thermal conductivity resin of claim 1.--

Signed and Sealed this
Sixth Day of November, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,216,672 B2 | Page 1 of 2 |
| APPLICATION NO. | : 11/152984 | |
| DATED | : July 10, 2012 | |
| INVENTOR(S) | : James David Blackhall Smith, Gary Stevens and John William Wood | |

It is certified that error appears in the above-identified patent and that said Letters Patent is hereby corrected as shown below:

Delete the title page and substitute therefore the attached title page showing the corrected number of claims in patent.

Col. 20, line 26, add claim 11 as follows: --11. An impregnated porous media comprising an insulating paper impregnated with the continuous high thermal conductivity resin of claim 1.--

This certificate supersedes the Certificate of Correction issued November 6, 2012.

Signed and Sealed this
Eleventh Day of December, 2012

David J. Kappos
*Director of the United States Patent and Trademark Office*

(12) United States Patent
Smith et al.

(10) Patent No.: US 8,216,672 B2
(45) Date of Patent: *Jul. 10, 2012

(54) STRUCTURED RESIN SYSTEMS WITH HIGH THERMAL CONDUCTIVITY FILLERS

(75) Inventors: James David Blackhall Smith, Monroeville, PA (US); Gary Stevens, Surrey (GB); John William Wood, Winter Springs, FL (US)

(73) Assignee: Siemens Energy, Inc., Orlando, FL (US)

(*) Notice: Subject to any disclaimer, the term of this patent is extended or adjusted under 35 U.S.C. 154(b) by 1045 days.

This patent is subject to a terminal disclaimer.

(21) Appl. No.: 11/152,984

(22) Filed: Jun. 14, 2005

(65) Prior Publication Data
US 2005/0277351 A1    Dec. 15, 2005

Related U.S. Application Data

(60) Provisional application No. 60/580,023, filed on Jun. 15, 2004.

(51) Int. Cl.
*B32B 7/12* (2006.01)
*H01L 23/24* (2006.01)

(52) U.S. Cl. .................. 428/343; 257/720
(58) Field of Classification Search .................. 428/343; 257/720
See application file for complete search history.

(56) References Cited

U.S. PATENT DOCUMENTS

| | | |
|---|---|---|
| 3,246,271 A | 4/1966 | Ford |
| 3,866,316 A | 2/1975 | Takechi et al. |
| 3,974,302 A | 8/1976 | Croop et al. |
| 4,001,616 A | 1/1977 | Lonseth et al. |
| 4,160,926 A | 7/1979 | Cope et al. |
| 4,335,367 A | 6/1982 | Mitsui et al. |
| 4,361,661 A * | 11/1982 | Jackson ............... 523/442 |
| 4,400,226 A | 8/1983 | Horrigan |
| 4,427,740 A | 1/1984 | Stackhouse et al. |
| 4,634,911 A | 1/1987 | Studniarz et al. |
| 4,694,064 A | 9/1987 | Tomalia et al. |
| 4,704,322 A | 11/1987 | Roberts |
| 4,760,296 A | 7/1988 | Johnston et al. |
| 4,806,806 A | 2/1989 | Hjortsberg et al. |
| 5,011,872 A | 4/1991 | Latham et al. |
| 5,037,876 A | 8/1991 | Birkle et al. |
| 5,126,192 A | 6/1992 | Chellis et al. |

(Continued)

FOREIGN PATENT DOCUMENTS

EP    0 157 936 A1    10/1985

(Continued)

OTHER PUBLICATIONS

Tari et al., "Impacts on Turbine Generator Design by the Application of Increased Thermal Conducting Stator Insulation" Cigre SC11-01 Meeting, Paper No. 132 (2002).

(Continued)

*Primary Examiner* — Victor Chang

(57) ABSTRACT

In one embodiment the present invention provides for a high thermal conductivity highly structured resin that comprises a host highly structured resin matrix, and a high thermal conductivity filler 30. The high thermal conductivity fillers are from 1-1000 nm in length, and high thermal conductivity fillers have an aspect ratio of between 3-100. Particular highly structured highly structured resins include at least one of liquid crystal 40 polymers, interpenetrating networks, dendrimer type matrices, expanding polymers, ladder polymers, star polymers and structured organic-inorganic hybrids 60.

11 Claims, 4 Drawing Sheets